United States Patent [19]

Toumazou et al.

[11] Patent Number: 5,960,183
[45] Date of Patent: Sep. 28, 1999

[54] SIGNAL PROCESSING CIRCUIT COMPRISING SWITCHED TRANSCONDUCTORS

[75] Inventors: Christofer Toumazou, Oxford; Nicolas Battersby, deceased, late of Northants, both of United Kingdom, by Charles Frederick Batersby, administrator

[73] Assignee: Imperial College of Science, Technology & Medicine, London, United Kingdom

[21] Appl. No.: 08/513,831

[22] PCT Filed: Feb. 25, 1994

[86] PCT No.: PCT/GB94/00385

§ 371 Date: May 15, 1996

§ 102(e) Date: May 15, 1996

[87] PCT Pub. No.: WO94/19763

PCT Pub. Date: Sep. 1, 1994

[30] Foreign Application Priority Data

Feb. 25, 1993 [GB] United Kingdom ............. 9303828

[51] Int. Cl.⁶ ..................................... G06F 9/455
[52] U.S. Cl. ....................................... 395/500.04
[58] Field of Search ............... 395/500; 330/260, 330/252, 291; 364/490, 480–485, 488, 489, 491

[56] References Cited

U.S. PATENT DOCUMENTS 4,035,688  7/1977  Mourier ................................ 315/39
5,189,321  2/1993  Seevinck .............................. 327/341
5,559,470  9/1996  Laber et al. .......................... 330/252

FOREIGN PATENT DOCUMENTS

0412609A3  2/1991  European Pat. Off. ........ G06G 7/184
0416699A1  3/1991  European Pat. Off. ......... G06G 7/18

OTHER PUBLICATIONS

Manfredi et al., Realization of some analog functions with switchable feedback loops, Milano, pp. 328–333, Apr. 29, 1982.

Khoury et al., Synthesis of arbitrary rational transfer functions in S using uniform distributed RC active circuits, IEEE, pp. 464–472, Apr. 1990.

*Primary Examiner*—Kevin J. Teska
*Assistant Examiner*—Matthew Loppnow
*Attorney, Agent, or Firm*—Fay, Sharpe, Beall, Fagan, Minnich & McKee

[57] ABSTRACT

A signal processing circuit which provides an accurate, continuously tunable impedance includes a tunable continuous time transconductor G(s) which may, for example, be an opto-electronic inductor. This has a discrete time current processor-H(z) connected between its input and output so as to provide current feedback. The discrete time current processor may be based on a switched current memory which can be adapted to provide scaler, differentiator or integrator configurations.

11 Claims, 4 Drawing Sheets

CIRCUIT STRUCTURE

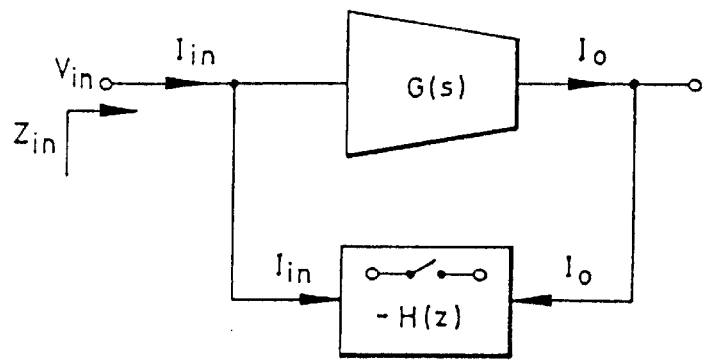
SWITCHED-TRANSCONDUCTANCE CONCEPT
FIG. 1
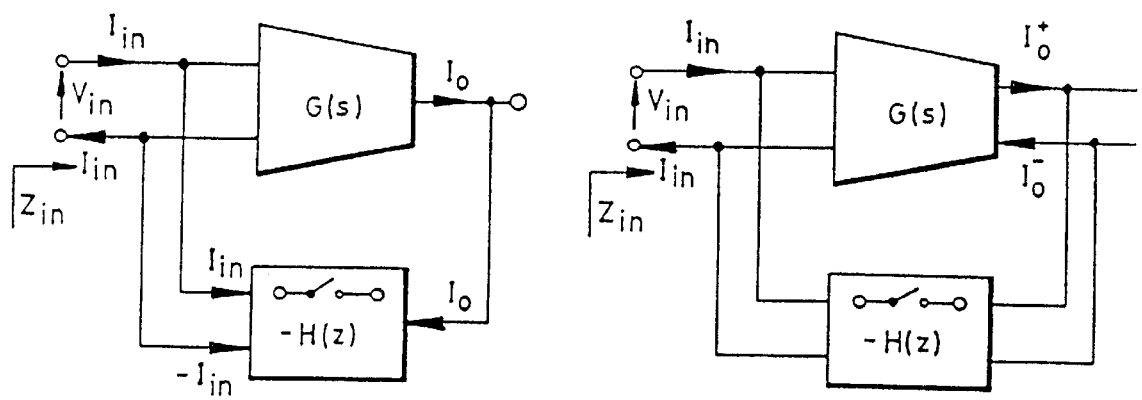
FIG. 2A
FIG. 2B
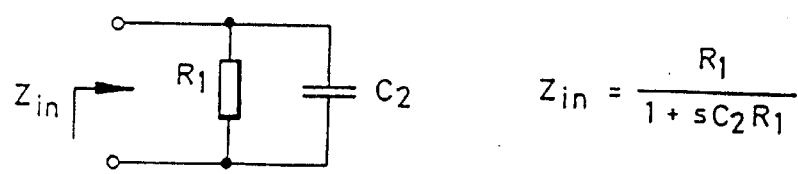
PARALLEL RC COMBINATION
FIG. 3

| LOSSLESS INTEGRATOR IMPLEMENTATIONS | TRANSFER FUNCTION | TRANSFER FUNCTION USING ST TECHNIQUES |
|---|---|---|
| TRANSCONDUCTANCE-CAPACITOR 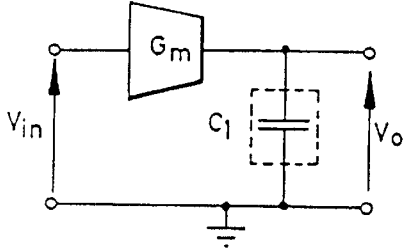 FIG. 4A | $H(s) = \dfrac{G_m}{sC_1}$ | $H(s) = \dfrac{G_m}{G_1}\dfrac{1}{sA_2}$ |
| ACTIVE RC 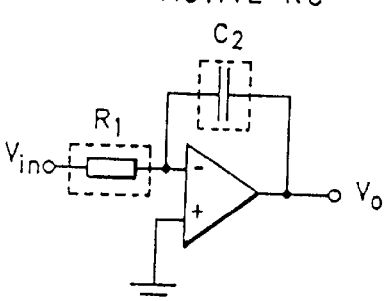 FIG. 4B | $H(s) = -\dfrac{1}{sR_1 C_2}$ | $H(s) = -\dfrac{1}{s\dfrac{G_2 A_2}{G_1 A_1}}$ |
| SWITCHED-CAPACITOR 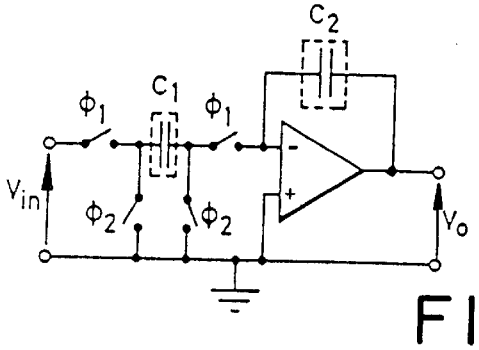 FIG. 4C | $H(z) = \dfrac{C_1/C_2}{1-z^{-1}}$ | $H(z) = -\dfrac{G_1 A_1 / G_2 A_2}{1-z^{-1}}$ |
FIG. 5
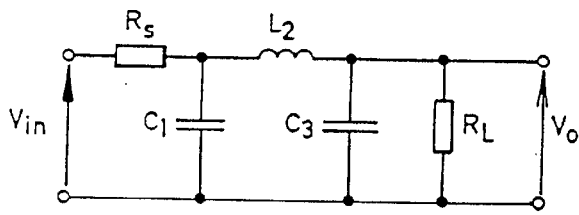

CIRCUIT STRUCTURE

CLOCK WAVEFORMS

CURRENT SCALER

INVERTING BACKWARD EULER SWITCHED-CURRENT DIFFERENTIATOR

INVERTING BACKWARD EULER LOSSLESS INTEGRATOR 5,960,183

SIGNAL PROCESSING CIRCUIT COMPRISING SWITCHED TRANSCONDUCTORS

This invention relates to a method of and apparatus for facilitating the accurate and continuously tunable processing of analogue electrical signals in a fully integratable way, without the need for post-manufacture trimming.

There are two basic ways in which analogue electrical signals can be processed, that is in the continuous or discrete time domains. In practical terms both methods have their pros and cons.

Continuous time filters, such as the transconductance-capacitor technique [1] offer very high speed potential and are continuously tunable. However, achieving very good inherent precision without resorting to a tuning scheme or trimming is not possible. This is because the accuracy of continuous time filters depends on the absolute value of components or the product or ratio of absolute values of components of differing types. Using standard integrated circuit processing technology it is not possible to reliably manufacture components whose absolute values are very accurately controlled without the use of post-manufacturing trimming. Furthermore, the absolute values of components is subject to drift with time, temperature and other physical stresses, thus a signal processor relying on absolute values will suffer from drift. Complex single or two loop on-chip tuning schemes may be employed to alleviate this problem.

Discrete time analogue signal processors, such a switched-capacitors or switched-currents, overcome the accuracy difficulties of continuous time processors by relying on the ratio of capacitor values or transistor sizes respectively. In integrated circuit form, it is possible to match the values of components of the same type accurately and thus realise very accurate discrete time analogue signal processors. Furthermore, the effect of component drift is much less severe because all the matched components will experience the same drift mechanisms. Although discrete time analogue signal processors exhibit good accuracy they have two very significant limitations. The first is that the signal bandwidth is limited to less than half the clock frequency, which is itself limited by the need to ensure good settling performance. This means that discrete time analogue signal processors are restricted to lower signal frequencies than their continuous counterparts for a given technology. The second disadvantage is that it is not possible to realise continuously tunable discrete time analogue signal processors and achieving even a degree of tunability requires cumbersome circuitry. The reason for this is that a ratio of components, capacitors in the case of switched-capacitors, determines the cut-off frequency and to tune this requires the switching in or out of capacitors. Thus to achieve good tunability in switched capacitors requires a large bank of capacitors occupying considerable area.

The present invention seeks to provide inherently accurate and continuously tunable analogue signal processors which can be manufactured using a standard digital integrated circuit process.

Accordingly the present invention provides a signal processing circuit comprising a tunable impedance which is made up of a tunable continuous time transconductor or transresistor and a discrete time current or voltage processor connected between its input and output so as to feed its output current or voltage back to its input. Thus the circuit presents an input impedance which is equal to the inverse of the product of the transfer functions of the transconductor and current processor (or transresistor and voltage processor). The following discussion is given generally in terms of transconductors and current processors but it will be appreciated that the same principles apply in respect of transresistors and voltage processors.

If the discrete time current processor is a scaler the overall input impedance mimics that of a resistor, if it is an integrator it mimics an inductor and if it is a differentiator it mimics a capacitor. Combination of switched-transconductance circuits, containing the above described discrete time current processors (or other similar current processors) perform a wide variety of tunable filtering and other analogue signal processing applications in which the transfer accuracy is determined by a ratio of transconductances and the precision of the discrete time current processor.

The tunable transconductor may for example be an optical transconductance device comprising an input stage including a field effect transistor arranged to drive a laser diode, and an output stage comprising a photodiode optically coupled to the laser diode. Such devices are described in more detail in our copending application no. (based on GB 9303846.1) filed on the same date as the present application.

Conversely, of course, a discrete-time voltage processor could be employed such as a switched capacitance, in which case the continuous-time processors would be a tunable transresistance stage.

Thus a preferred embodiment of the present invention provides a method of signal processing which combines the tunability of a continuous time transconductor (or transresistor) with the accuracy of an analogue discrete time current (or voltage) processor to synthesise a tunable analogue signal processor whose accuracy depends on the independent ratios of transconductors (or transresistors) and transistors (or capacitors).

Some embodiments of the invention will now be described by way of example with reference to the accompanying drawings in which:

FIG. 1 is a schematic diagram of a switched transconductance signal processor:

FIG. 2A is a schematic diagram of a switched transconductance signal processor involving the synthesis of floating impedances;

FIG. 2B is a schematic diagram of another switched transconductance signal processor involving the synthesis of floating impedances;

FIG. 3 is a schematic diagram of a parallel RC combination for obtaining an accurate time constant;

FIG. 4A is a schematic diagram of a switched transcondance signal processor used in a transconductance-capacitor type of filter;

FIG. 4B is a schematic diagram of a switched transcondance signal processor employed in an active-RC type of filter;

FIG. 4C is a schematic diagram of a switched transcondance signal processor in a switched capacitor type of filter;

FIG. 5 shows a third order lowpass ladder filter;

FIG. 6b shows clock waveforms for the circuit of FIG. 6a;

Figure 6A:
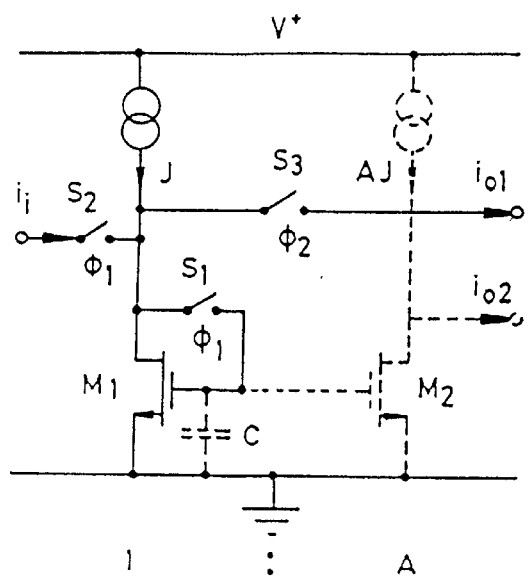
FIG. 6a illustrates the circuit structure of a switched current memory cell.

Referring to FIG. 1, if the transconductance gain of the transconductor $Io/V_{in}$ is $G(s)$, and the transfer function of the discrete time current processor $I_{in}/I_o$ is $-H(z)$, then the input impedance of the circuit is $$Z_{in}(z) = \frac{-1}{G(s)H(z)} \quad (1)$$

(In the case of the voltage processor and transresistance combination, the input impedance would be $-R(s) H(z)$. In the remainder of the description we have referred specifically to time current processor/transconductor combination but it will be appreciated that the same principles apply to the voltage processor/transresistance combination.) Thus the basic switched-transconductance element synthesises a grounded impedance whose value is determined by the value of the transconductor $G(s)$ and the transfer function of the discrete time current processor $H(z)$. By choosing appropriate discrete time functions, $H(z)$, a whole range of impedances can by synthesised, some of which mimic physical components. To illustrate the concept, Table 1 shows the discrete time current processing functions $H(z)$ that can be used to mimic physical components using the backward euler transformation $s \to (1-z^{-1})$, the forward euler transformation $s \to (1-z^{-1})/z^{-1}$ and the bilinear transformation $s \to (2/T)(1+z^{-1})/(1-z^{-1})$. In Table 1 the transconductance gain $G$ has been taken to be non-inverting, and whose cut-off frequency can be assumed to be much greater than the signal frequency, whilst $H(z)$ is inverting, clearly it is possible to reverse this and obtain the same transfer function. Alternatively if $H(z)$ and $G$ have the same sign a negative impedance can be synthesised.

TABLE 1

Impedance synthesis of physical components

| Discrete Time current Processor | H(z) | $Z_{in}(z)$ | Equivalent Physical component |
|---|---|---|---|
| Scaler | $-A$ | $\dfrac{1}{GA}$ | Resistor $R = \dfrac{1}{GA}$ |
| Backward Euler integrator | $-\dfrac{A}{1-z^{-1}}$ | $\dfrac{1-z^{-1}}{GA}$ | Inductor $L = \dfrac{T}{GA}$ |
| Forward Euler integrator | $-\dfrac{Az^{-1}}{1-z^{-1}}$ | $\dfrac{1-z^{-1}}{GAz^{-1}}$ | Inductor $L = \dfrac{T}{GA}$ |
| Bilinear integrator | $-\dfrac{A}{2}\dfrac{1+z^{-1}}{1-z^{-1}}$ | $\dfrac{2}{GA}\dfrac{1-z^{-1}}{1+z^{-1}}$ | Inductor $L = \dfrac{T}{GA}$ |
| Backward Euler differentiator | $-A(1-z^{-1})$ | $\dfrac{1}{GA(1-z^{-1})}$ | Capacitor $C = T*GA$ |
| Forward euler differentiator | $\dfrac{(1-z^{-1})}{z^{-1}}$ | $\dfrac{z^{-1}}{GA(1-z^{-1})}$ | Capacitor $C = T*GA$ |

TABLE 1-continued

Impedance synthesis of physical components

| Discrete Time current Processor | H(z) | $Z_{in}(z)$ | Equivalent Physical component |
|---|---|---|---|
| Bilinear differentiator | $-\dfrac{2}{T}\dfrac{1-z^{-1}}{1+z^{-1}}$ | $\dfrac{1}{2GA}\dfrac{1+z^{-1}}{1-z^{-1}}$ | Capacitor $C = T*GA$ |

It has been demonstrated above that the switched-transconductance technique can be used to synthesise the grounded impedance of a wide range of components, both physical and imaginary. The use of differential structures allows this technique to be extended to the realisation of identical floating impedances as illustrated in FIG. 2.

Composite Elements

In the previous section the switched-transconductance concept was explained and it was shown that it could be used to synthesise a wide variety of tunable impedances. In this section the combination of simple switched transconductance elements to form more complex structures will be described, in which time constants depend on ratios of transconductances and transistor sizes (if the discrete time current processor is a switched current circuit). Note that, in the following discussions of composite elements and filters, all expressions have been normalised with respect to the clock frequency (i.e. $T=1$) in order to better illustrate the fundamental principles of the present invention.

The means by which the time constants of composite elements depend on ratios is best explained by considering the simple example of a parallel resistance ($R_1$) and capacitance ($C_2$) as shown in FIG. 3.

From the FIG. 3 it is obvious that to obtain an accurate time constant requires accurate absolute values of both $R_1$ and $C_2$, which is difficult to achieve in practice. However, now consider the case where $R_1$ and $C_2$ are replaced by their switched-transconductance equivalents from Table 1.

Backward Euler $s \to z$ mapping (2)

$$Z_{in}(z) = \left[\frac{1}{G_1 A_1}\right] \frac{1}{1 + (1-z^{-1})\left[\frac{G_2 A_2}{G_1 A_1}\right]}$$

Forward Euler $s \to z$ mapping (3)

$$Z_{in}(z) = \left[\frac{1}{G_1 A_1}\right] \frac{z^{-1}}{\frac{G_2 A_2}{G_1 A_1} + z^{-1}\left[1 - \frac{G_2 A_2}{G_1 A_1}\right]}$$

Bilinear $s \to z$ mapping (4)

$$Z_{in}(z) = \left[\frac{1}{G_1 A_1}\right] \frac{1}{1 + \frac{2}{T}\left[\frac{1+z^{-1}}{1-z^{-1}}\right]\left[\frac{G_2 A_2}{G_1 A_1}\right]}$$

Applying their respect $z \to s$ mappings (3), (4) and (5) all yield the following impedance in the s domain, for signal frequencies much lower than the clock frequency.

$$Z_{in}(s) = \left[\frac{1}{G_1 A_1}\right] \frac{1}{1 + s\frac{G_2 A_2}{G_1 A_1}} \quad (5)$$

Examining (5) it is clear that the pole frequency of the impedance depends on a ratio of transconductances and the scale factors of the discrete time current processor. Since both of these are ratios of similar components they can be accurately controlled, resulting in an inherently accurate time constant without the use of trimming or tuning. The impedance level itself is less well controlled, being the product of a transconductance and a scale factor, but in filter applications the control of cut-off frequency is of paramount importance. Furthermore, gain control is simple to achieve whilst frequency control is not.

In calculating (6) it has been assumed that the signal frequencies employed are much lower than that of the clock and so simple mappings can be used. The exact frequency responses of (2), (3) and (4), which are valid for all frequencies, are shown below in (6), (7) and (8) respectively.

Backward Euler mapping (6)

$$Z_{in}(e^{j\omega T}) = \left[\frac{1}{G_1 A_1}\right] \frac{e^{j\omega T/2}}{1 + j\left[1 + \frac{2G_2 A_2}{G_1 A_1}\right]\tan\frac{(\omega T)}{(2)}}$$

Forward Euler mapping (7)

$$Z_{in}(e^{j\omega T}) = \left[\frac{1}{G_1 A_1}\right] \frac{e^{j\omega T/2}}{1 + j\left[\frac{2G_2 A_2}{G_1 A_1} - 1\right]\tan\frac{(\omega T)}{(2)}}$$

Bilinear mapping (8)

$$Z_{in}(e^{j\omega T}) = \left[\frac{1}{G_1 A_1}\right] \frac{1}{1 + j\frac{2}{T}\left[\frac{G_2 A_2}{G_1 A_1}\tan\frac{(\omega T)}{(2)}\right]}$$

The above discussion has shown how the switched-transconductance technique can be used to emulate a parallel resistance and capacitance, with an accurate pole frequency. From this simple example the concept can be extended to encompass a wide range of combinations, to illustrate this the basic series and parallel combinations of a resistor, capacitor and inductor are detailed in Table 2.

TABLE 2

Basic Series and Parallel Combinations of a Resistor, Capacitor and Inductor

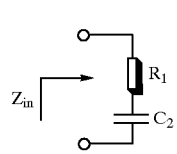
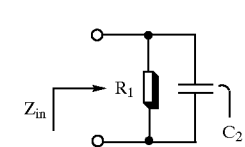
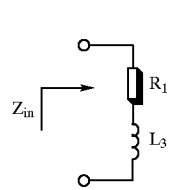
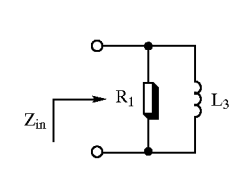
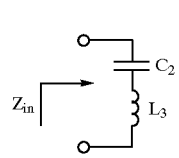
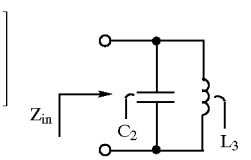
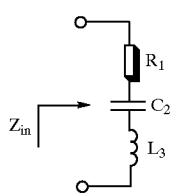
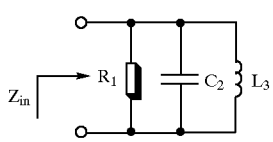

TABLE 2-continued

Basic Series and Parallel Combinations of a Resistor, Capacitor and Inductor $$Z_{in} = \frac{1}{G_2 A_2} \left[ \frac{1 + s\frac{G_2 A_2}{G_1 A_1} + s^2 \frac{G_2 A_2}{G_3 A_3}}{s} \right] \qquad Z_{in} = \frac{1}{G_3 A_3} \left[ \frac{s}{1 + s\frac{G_1 A_1}{G_3 A_3} + s^2 \frac{G_2 A_2}{G_3 A_3}} \right]$$

From Table 2, it can be seen that in all the cases shown the pole/zero frequencies of the synthesised impedance depend on the ratio of transconductances and scale factors and can be controlled with a high degree of precision.

Filter Applications

By combining the basic structures shown in Table 2 it is possible to use the switched-transconductance technique to synthesise a wide variety of filter structures and still maintain the pole/zero frequency on ratios.

In addition to the application of switched-transconductance techniques to the synthesis of tunable monolithic passive networks the technique can usefully be applied to transconductance-capacitor filters [1], active-RC filters [2] and switched-capacitor filters [3]. To demonstrate this FIG. 4 illustrates the application of ST techniques in lossless integrators using each of these filter structures.

The advantage of the switched-transconductance technique when applied to transconductance capacitor and active-RC filters is that precision can be obtained without the need for frequency locked tuning schemes. Whilst for the switched-capacitor technique, the advantage is that continuous tuning is made possible and, if the discrete time current processor is a switched-current circuit, the need for linear floating capacitors is eliminated.

Thus the example shown in the middle diagram of FIG. 4 is particularly useful in providing a monolithic continuously tunable linear floating capacitor with digital process technology.

So far, the discussion has centred on very simple filter building blocks but now consider a more practical example, that of the third order lowpass ladder filter shown in FIG. 5.

The voltage transfer function H(s) of this filter is given by $$H(s) = \frac{1}{s^3 L_2 R_s C_1 C_3 + s^2 (L_2 C_3 + L_2 C_1 R_s / R_L) + s(C_3 R_s + R_s C_1 + L_2 / R_L + R_s / R_L + 1)} \qquad (9)$$

Now consider replacing each of the physical components in the network with a corresponding switched-transconductance element. Then substituting the equivalent component value (from Table 1) into (9) gives the transfer function.

$$Hs = \frac{1}{s_3 \left[\frac{G_1 A_1 G_3 A_3}{G_2 A_2 G_s A_s}\right] + s^2 \left[\frac{G_3 A_3}{G_2 A_2} + \frac{G_1 A_1 G_L A_L}{G_2 A_2 G_s A_s}\right] + s\left[\frac{G_s A_s}{G_3 A_3} + \frac{G_1 A_1}{G_s A_s} + \frac{G_L A_L}{G_2 A_2}\right] + \left[\frac{G_L A_L^+}{G_s A_s}\right]} \qquad (10)$$

Equation (10) shows that all the coefficients of the ladder filter (FIG. 5) are composed of combinations of ratios of transconductances and scale factors. Thus using the switched-transconductance technique very accurate and continuously tunable passive filters can be synthesised in monolithic form for the first time. These conclusions can also be extended to other filter structures, making the switched-transconductance technique a powerful technique for the synthesis of general monolithic tunable filters.

Realisations

In order for the switched-transconductance technique to be viable it is necessary to be able to realise a linear tunable transconductor and an accurate discrete time current processor. It is a relatively simple matter to realise a linear tunable transconductor and a number are described in the open literature [4]. The preferred realisation of the discrete time current processor is the switched-current technique, in which the maximum accuracy is determined by transistor matching and hence good coefficient accuracy is possible.

The idea on which the switched-current technique is based is that an MOS transistor requires no gate current in order to maintain a constant flow of current between its drain and source terminals. The first application of this idea seems to date back to 1972 [5], however, its use as a discrete time analogue signal processing technique is more recent.

Figure 6B:
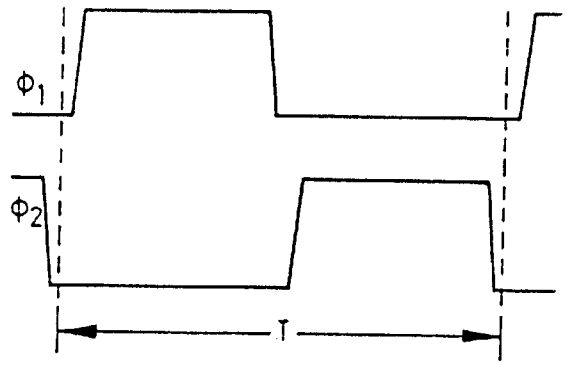

The basic element of the technique is the so-called switched-current memory or current copier cell, shown in FIG. 6, which functions as a simple current track-and-hold element [6–9].

To realise switched-transconductance simulations of resistive, capacitive and inductive components requires the provision of a switched-current scaler, differentiator and integrator respectively.

Figure 7:
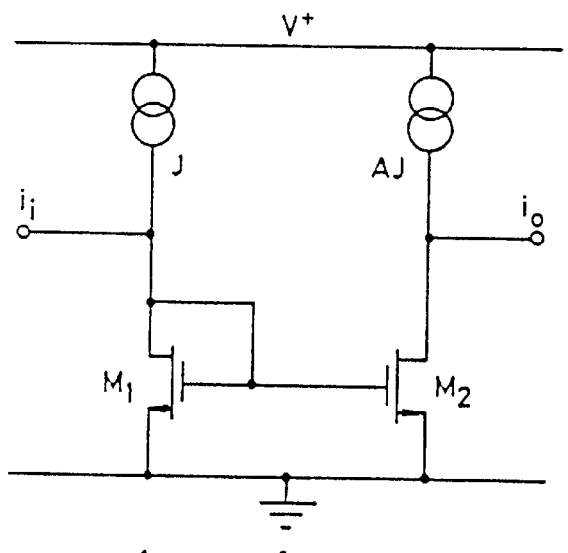
FIG. 7 shows a current scaler circuit.

The current scaler (FIG. 7) is simply a current mirror and has the transfer function $$H(s) = -A \qquad (11)$$

Figure 8:
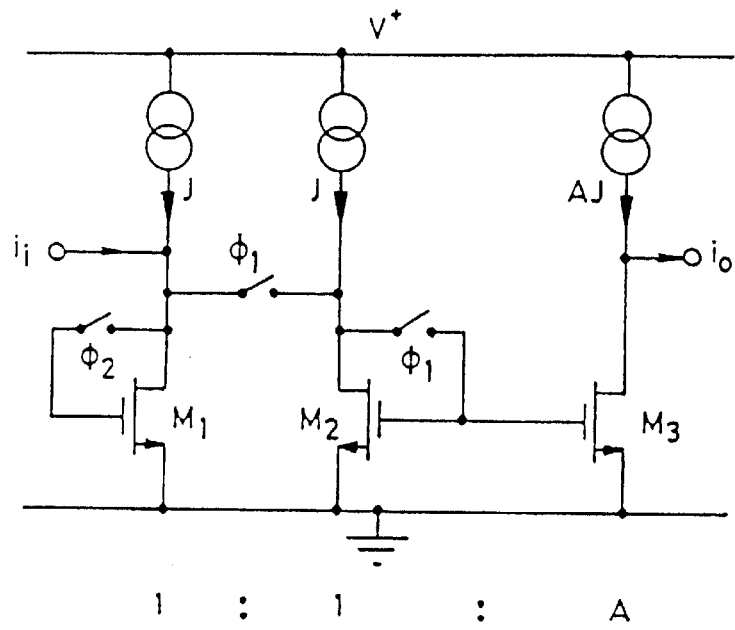
FIG. 8 shows an inverting backward euler switched current differentiatior.

There are a number of possible switched-current differentiator circuits [10] and an inverting backward euler differentiator is illustrated in FIG. 8, the transfer function of this circuit is $$H(z) = -A(1 - Z^{-1}) \qquad (12)$$

Figure 9:
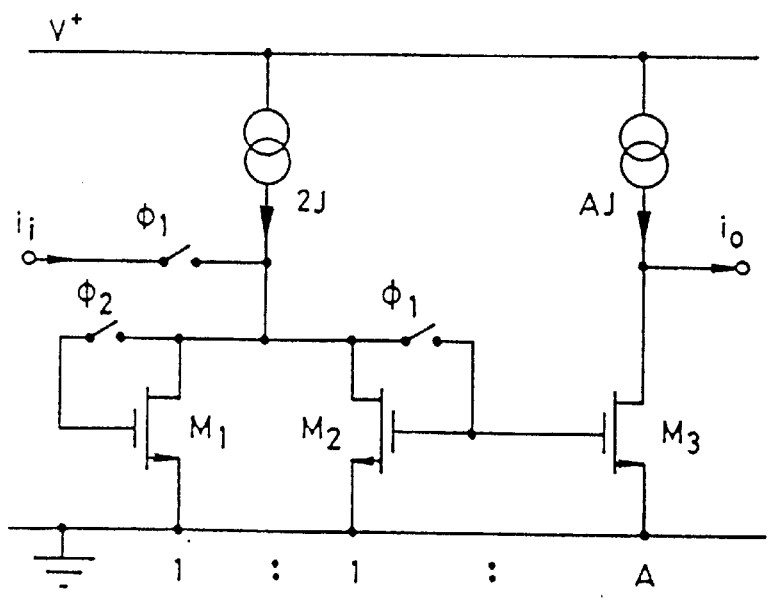
FIG. 9 shows an inverting backward euler lossless integrator.

FIG. 9 shows an inverting backward euler lossless integrator, whose transfer function is given by $$H(z) = \frac{-A}{1 - z^{-1}} \qquad (13)$$

Thus it will be appreciated that the present invention provides a new analogue signal processing technique, which combines the inherent accuracy of analogue sampled-data techniques with the continuous tunability of continuous time techniques. Since the accuracy of the technique depends on the independent ratios of transconductances and transistor sizes, good accuracy without trimming or tuning is possible. Furthermore, continuous tuning is possible by simply tuning transconductance values and the technique is applicable to a wide variety of filter types. As described above, switched-current building blocks are the preferred implementation of the discrete time current processor.

References

[1] R. Schaumann and M. A. Tan, "Continuous-time filters", in Analogue IC Design: "The Current Mode Approach" C. Toumazou, D. G. Haigh and F. J. Lidgey (Eds), London: Peter Peregrinus Ltd., 1990.

[2] M. Banu and Y. P. Tsividis, "Fully integrated active RC filters in MOS technology", IEEE J. Solid-State Circuits, vol. SC-18, pp. 644–651, December 1983.

[3] R. Gregorian and G. C. Temes, "Analog MOS Integrated Circuits for Signal Processing", New York: John Wiley & Sons, 1986.

[4] S. T. Dupie and M. Ismail, "High Frequency CMOS Transconductors", in Analogue IC Design: "The Current Mode Approach", C. Toumazou, D. G. Haigh and F. J. Lidgey (Eds), London: Peter Peregrinus Ltd, 1990.

[5] S. Matsuzaki and I. Kondo, "Information Holding Apparatus", UK Patent 1359105, Jul. 10, 1974, Assignee: Olympus Camera, filed Jul. 6, 1972.

[6] N. C. Bird, "Storing Sampled Analogue Electrical Currents", UK Patent 2209895, May 24, 1989, Assignee: Philips Electronic & Associated Industries Ltd, Filed Sep. 16, 1987

[7] N. C. Bird, "A Method of and a Circuit Arrangement for Processing Sampled Analogue Electrical Signals", UK Patent 2213011, Aug. 2, 1989, Assignee: Philips Electronic and Associated Industries Ltd, Filed Sep. 16, 1987.

[8] N. C. Bird, "Circuit Arrangement for Storing Sampled Analogue Electrical Currents", U.S. Pat. No. 4,866,368, Assignee: U.S. Philips Corporation, Filed Sep. 14, 1988.

[9] J. B. Hughes, "Circuit Arrangement for Processing Sampled Analogue Electrical Signals", UK Patent 2216740 Oct. 11, 1989, Assignee: Philips Electronic and Associated Industries Ltd, Filed Jul. 6, 1988

[10] J. B. Hughes, "Differentiator Circuit", UK Patent 2235799, Mar. 13, 1991, Assignee: Philips Electronic and Associated Industries Ltd, Filed Sep. 6, 1989.

We claim:

1. A signal processing circuit, having an input and an output, for providing a tunable impedance in a sample-data filter, comprising:

a tunable continuous time transconductor (or transresistor) having a transconductor function $G(s)$ (or transresistor function $R(s)$); and a discrete time current (or voltage) processor $-H(z)$, the transconductor and the processor being connected between the input and the output of the signal processing circuit, an output current (or voltage) of the circuit being fed back to the input, the discrete time current (or voltage) processor $-H(z)$ being continuously tunable by the transconductor function, an accuracy of the sample data filter being determined by a ratio of transconductors (or transresistors) in the tunable continuous time transconductor function (or transresistor function).

2. A signal processing circuit according to claim 1 in which the discrete time current (or voltage) processor is a scaler so that the overall input impedance mimics that of a resistor.

3. A signal processing circuit according to claim 1 in which the discrete time current (or voltage) processor is an integrator so that the overall input impedance mimics that of an inductor.

4. A signal processing circuit according to claim 1 in which the discrete time current (or voltage) processor is a differentiator so that the overall input impedance mimics that of a capacitor.

5. A signal processing circuit according to claim 1 in which the tunable transconductance (or tranresistance) comprises an optically-coupled transconductance (or transresistance) device.

6. A signal processing circuit according to claim 5 in which the transconductance (or transresistance) device comprises an input stage including a field effect transistor arranged to drive a laser diode, and an output stage comprising a photodiode optically coupled to the laser diode.

7. A signal processing circuit according to claim 1 in which the discrete time current (or voltage) processor comprises a switched current (or voltage) memory cell in which a switched output current (or voltage) is produced in response to the switching of an input current (or voltage).

8. A signal processing circuit according to claim 7 in which the discrete time current processor comprises a current mirror (or voltage amplifier) having a transfer function $H(s)=-A$, which acts as a scaler (or an amplifier).

9. A signal processing circuit according to claim 7 in which the discrete time current (or voltage) processor comprises a differentiator or integrator using any suitable $s \rightarrow z$ domain transformation.

10. A signal processing circuit, having an input and an output, for providing a transfer function in a sample-data filter, comprising:

a tunable continuous time transconductor $G(s)$ (or transresistor $R(s)$); and a discrete time current (or voltage) processor $-H(z)$, the transconductor (or transresitor) and the processor being connected between the input and the output, an output current (or voltage) of the circuit being fed from the output to the input, the discrete time current (or voltage) processor $-H(z)$ providing the transfer function.

11. A signal processing circuit, having an input and an output, for providing tunable impedance in a sample-data filter, comprising:

a tunable continuous time transconductor function (or transresistor function); and a discrete time function, the tunable continuous time transconductor function (or transresistor function) and the discrete time function being connected between the input and the output, an output current (or voltage) of the circuit being fed from the output to the input, a ratio of transconductors (or transresistors) in the continuous time transconductor function (or transresistor function) determining a time constant of the filter for continuously tuning the circuit.

* * * * *